United States Patent
Jiang et al.

(10) Patent No.: US 6,455,411 B1
(45) Date of Patent: Sep. 24, 2002

(54) DEFECT AND ETCH RATE CONTROL IN TRENCH ETCH FOR DUAL DAMASCENE PATTERNING OF LOW-K DIELECTRICS

(75) Inventors: Ping Jiang, Plano; Francis G. Celii, Dallas; Kenneth J. Newton, McKinney; Hiromi Sakima, Richardson, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/947,966

(22) Filed: Sep. 6, 2001

Related U.S. Application Data

(60) Provisional application No. 60/231,813, filed on Sep. 11, 2000.

(51) Int. Cl.[7] .............................................. H01L 21/308
(52) U.S. Cl. ........................ 438/624; 438/638; 438/706; 438/790
(58) Field of Search .................................. 438/624, 638, 438/706, 743, 763, 790

(56) References Cited

U.S. PATENT DOCUMENTS

| | | | |
|---|---|---|---|
| 6,180,540 B1 * | 1/2001 | Jang | 438/784 |
| 6,204,192 B1 * | 3/2001 | Zhao et al. | 438/723 |
| 6,211,092 B1 * | 4/2001 | Tang et al. | 438/719 |
| 6,232,237 B1 * | 5/2001 | Tamaoka et al. | 438/725 |
| 6,284,149 B1 * | 9/2001 | Li et al. | 216/64 |
| 6,316,351 B1 * | 11/2001 | Chen et al. | 438/638 |
| 6,326,296 B1 * | 12/2001 | Tsai et al. | 438/624 |
| 6,372,634 B1 * | 4/2002 | Qiao et al. | 438/637 |
| 2001/0008226 A1 * | 7/2001 | Hung et al. | 216/18 |
| 2002/0038910 A1 * | 4/2002 | Inoue et al. | 257/758 |

\* cited by examiner

*Primary Examiner*—Keith Christianson
*Assistant Examiner*—Stephen W. Smoot
(74) *Attorney, Agent, or Firm*—Jacqueline J. Garner; W. James Brady, III; Frederick J. Telecky, Jr.

(57) ABSTRACT

A dual damascene process for low-k or ultra low-k dielectric such as organo-silicate glass (OSG). After the via (112) etch, a trench (121) is etched in the OSG layer (108) using a less-polymerizing fluorocarbon added to an etch chemistry comprising a fluorocarbon and low $N_2/Ar$ ratio. The low $N_2/Ar$ ratio controls ridge formation during the trench etch. The combination of a less-polymerizing fluorocarbon with a higher-polymerizing fluorocarbon achieves a high etch rate and defect-free conditions.

18 Claims, 4 Drawing Sheets

DEFECT AND ETCH RATE CONTROL IN TRENCH ETCH FOR DUAL DAMASCENE PATTERNING OF LOW-K DIELECTRICS

CROSS-REFERENCE TO RELATED APPLICATIONS:

This application claims priority under 35 USC §119(e)(1) of provisional application nos. 60/231,813 filed Sep. 11, 2000.

The following co-pending application is related and hereby incorporated by reference: U.S. patent application Ser. No. 09/521,325, filed Mar. 9, 2000 by Tsu et al.

FIELD OF THE INVENTION

The invention is generally related to the field of forming interconnect layers in integrated circuits and more specifically to dual damascene interconnect processes with Cu and low-k dielectrics.

BACKGROUND OF THE INVENTION

As the density of semiconductor devices increases, the demands on interconnect layers for connecting the semiconductor devices to each other also increase. Therefore, there is a desire to switch from the traditional aluminum metal interconnects to copper interconnects. Unfortunately, suitable copper etches for a semiconductor fabrication environment are not readily available. To overcome the copper etch problem, damascene processes have been developed.

In a conventional interconnect process, the aluminum (and any barrier metals) are deposited, patterned, and etched to form the interconnect lines. Then, an interlevel dielectric (ILD) is deposited and planarized. In a damascene process, the ILD is formed first. The ILD is then patterned and etched. The metal is then deposited over the structure and then chemically-mechanically polished to remove the metal from over the ILD, leaving metal interconnect lines. A metal etch is thereby avoided.

One prior art damascene process, a dual damascene process, is described with reference to FIGS. 1A–E. Referring to FIG. 1A, a silicon nitride layer 12 is deposited over a semiconductor body 10. Semiconductor body 10 will have been processed through a first metal interconnect layer. A via level dielectric 14 is deposited over silicon nitride layer 12. Via dielectric layer 14 comprises FSG (fluorine-doped silicate glass). Another silicon nitride layer 18 is deposited over via level dielectric 14 and a second, trench level dielectric 20 is deposited over silicon nitride layer 18. A via 22 is then patterned and etched through the trench level dielectric 20, silicon nitride layer 18 and via level dielectric 14. Silicon nitride layer 12 is used as an etch-stop.

Referring to FIG. 1B, a spin-on organic barc (bottom anti-reflection coating) 24 is deposited to fill a portion of via 22. The result is approximately 600 Å of barc over dielectric 20 and a thickness of ~2000–2500 Å inside the via 22. Barc 24 protects via 22 during the subsequent trench etch. Next, the trench pattern 26 is formed on the structure as shown in FIG. 1C. Trench pattern 26 exposes areas of trench level dielectric 20 (with about 600 Å of barc on top of dielectric 20) where the metal interconnect lines are desired. Referring to FIG. 1D, the trench etch to remove portions of FSG layer 20 is performed. Oxide ridges 28 may undesirably form on the edges of via 22. Pattern 26 is removed as shown in FIG. 1E. Oxide ridges impair device reliability due to the fact that it is difficult to ensure that a metal barrier completely covers the oxide ridges.

Newer technologies are switching to even lower-k dielectrics such as organo-silicate glass (OSG) in place of FSG. Dual damascene processes for working with the newer dielectrics are needed.

SUMMARY OF THE INVENTION

A dual damascene process for low-k and ultra-low-k dielectrics is disclosed herein. After the via etch, a trench is etched using a less-polymerizing fluorocarbon added to an etch chemistry comprising a fluorocarbon and low $N_2/Ar$ ratio. The low $N_2/Ar$ ratio controls ridge formation during the trench etch. The combination of a less-polymerizing fluorocarbon with a high-polymerizing fluorocarbon achieves a high etch rate and defect-free conditions.

An advantage of the invention is providing a dual damascene process that avoids or minimizes the formation of via ridges while maintaining a high etch rate and good CD control.

This and other advantages will be apparent to those of ordinary skill in the art having reference to the specification in conjunction with the drawings.

DETAILED DESCRIPTION OF THE EMBODIMENTS

The invention will now be described in conjunction with a dual damascene copper interconnect process. It will be apparent to those of ordinary skill in the art that the benefits of the invention can be applied to other fabrication processes such as other dual damascene processes.

A fabrication process according to an embodiment of the invention will now be discussed with reference to FIGS. 2A–2E. A semiconductor body 100 is processed through the formation of a first interconnect layer 102 as is known in the art. (Although referred to herein as the first interconnect layer 102, layer 102 may be any interconnect layer except the uppermost interconnect layer.) An etch-stop layer 104 is deposited over the first interconnect layer 102. Etch-stop layer 104 typically comprises silicon nitride, but other suitable etch-stop layers are known in the art (e.g., SiC). As an example, the thickness of etch-stop layer 104 may be on the order of 1000 Å (e.g., 500 Å–1000 Å).

Figure 1A:
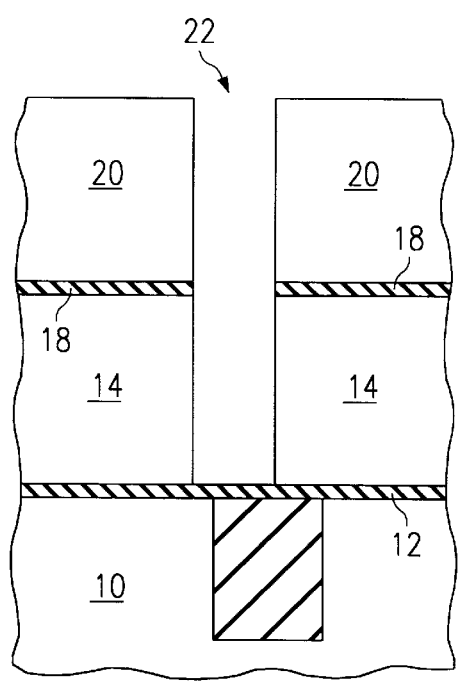
FIGS. 1A–1E are cross-sectional diagrams of a prior art dual damascene process at various stages of fabrication.
Figure 1B:
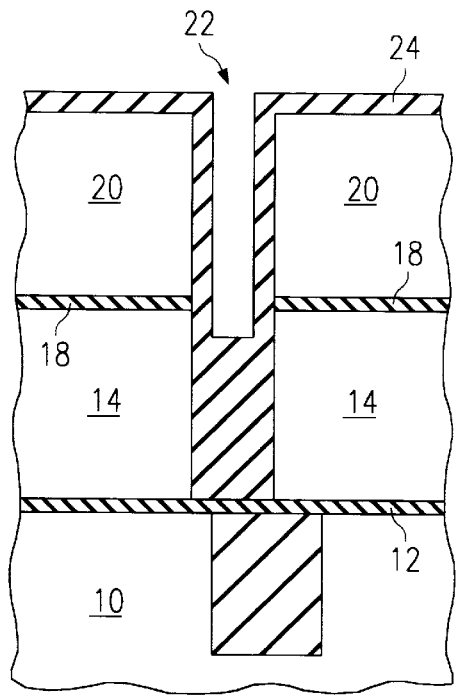
Figure 1C:
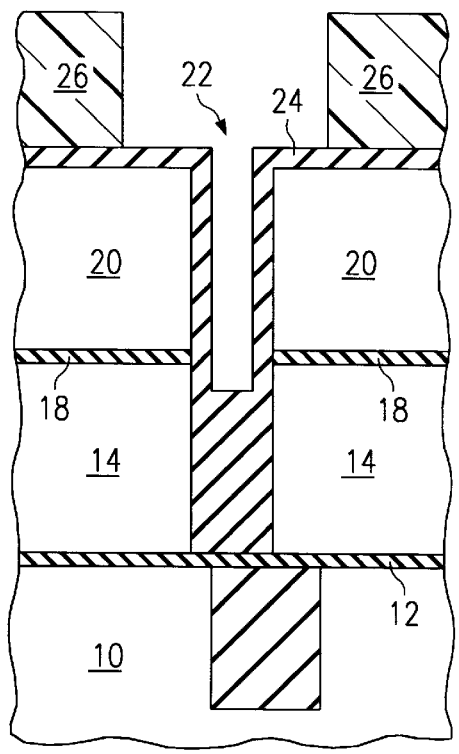
Figure 1D:
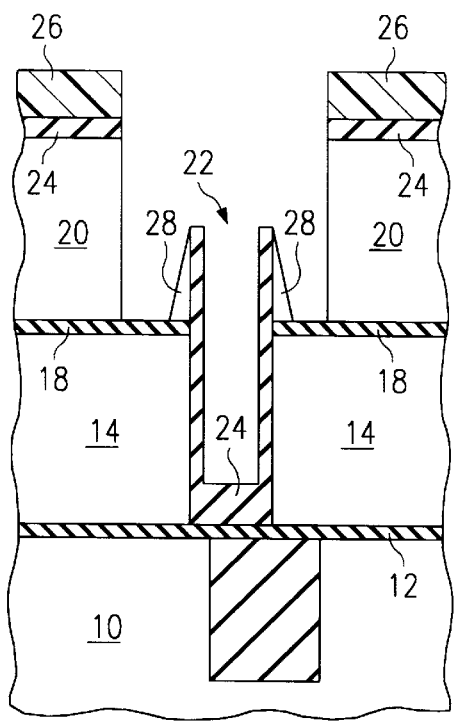
Figure 1E:
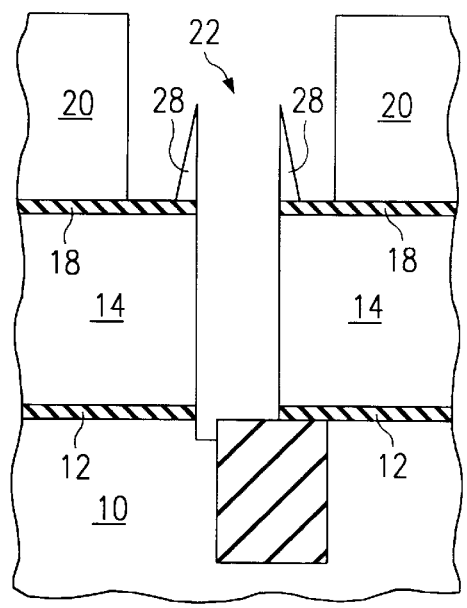
Figure 2A:
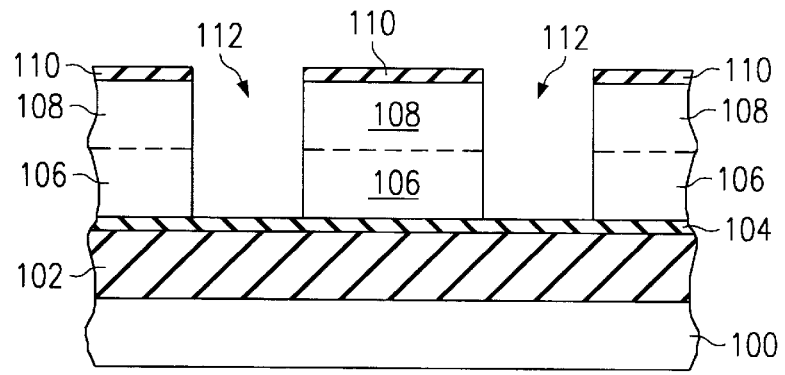
FIGS. 2A–2E are cross-sectional diagrams of a dual damascene process according to the invention at various stages of fabrication.

The via level dielectric 106 (sometimes referred to as interlevel dielectric-ILD) and trench level dielectric 108 (sometimes referred to as intrametal dielectric-IMD) are formed over etch-stop layer 104. As shown in FIG. 2A, ILD 106 and IMD 108 can be a single layer. In the preferred embodiment, OSG is the material used for ILD 106 and IMD 108. OSG is a low-k material having a dielectric constant in the range of 2.7–3.0. Alternatively, ILD 106 and IMD 108 may comprise a low-k (<3.5) or an ultra-low-k (<2.7) dielectric. The combined thickness of ILD 106 and IMD 108 may be approximately 9000 Å.

An etch-stop layer is not necessary between ILD 106 and IMD 108. However, one could be included if desired. Eliminating the etch-stop layer between the ILD 106 and IMD 108 has the advantage of reducing parasitic capacitance.

Sometimes a capping layer 110 is formed over IMD 108. As an example, oxide capping layer may be deposited using a plasma enhanced tetraethyoxysilane (PETEOS) process. In the preferred embodiment, the thickness of oxide capping layer is approximately 1500 Å. Silicon nitride could also be used as a capping layer. It should be noted that a barc layer is often used under the resist for both via and trench pattern. In the preferred embodiment, no hardmask is used.

Referring to FIG. 2A, vias 112 are etched through the barc and the capping layer 110 (if present), IMD 108, and ILD 106. The via etch-stops on etch-stop layer 104. Vias 112 are formed in areas where connection is desired between two metal interconnect layers. If an additional etch-stop layer was included between IMD 108 and ILD 106, the via etch also etches through this additional etch-stop layer. In the preferred embodiment, the via etch chemistry comprises $C_5F_8$, $N_2$ and CO.

Figure 2B:
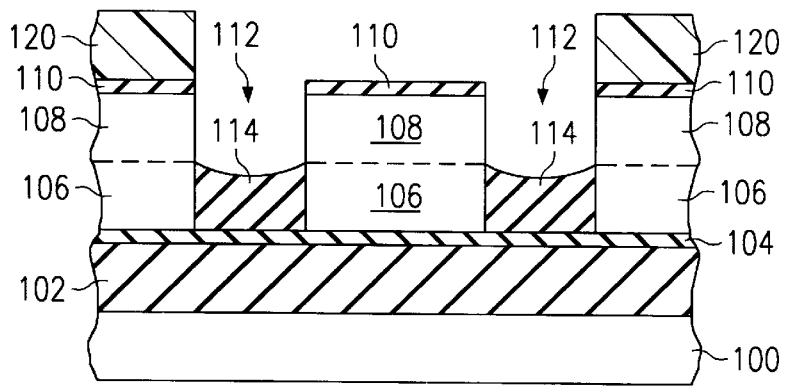

Referring to FIG. 2B, a spin-on barc 114 is coated to fill a portion of via 112. The result is approximately 850A of barc over capping layer 110 and a thickness of ~4500 Å–7000 Å inside the via 112 (the barc thickness inside the via depends on the via density.). Barc 114 protects the bottom of via 112 during the subsequent trench etch.

Still referring to FIG. 2B, the trench pattern 120 is formed. Trench pattern 120 exposes the areas where metal interconnect lines of a second or subsequent metal interconnect layer are desired.

Figure 2C:
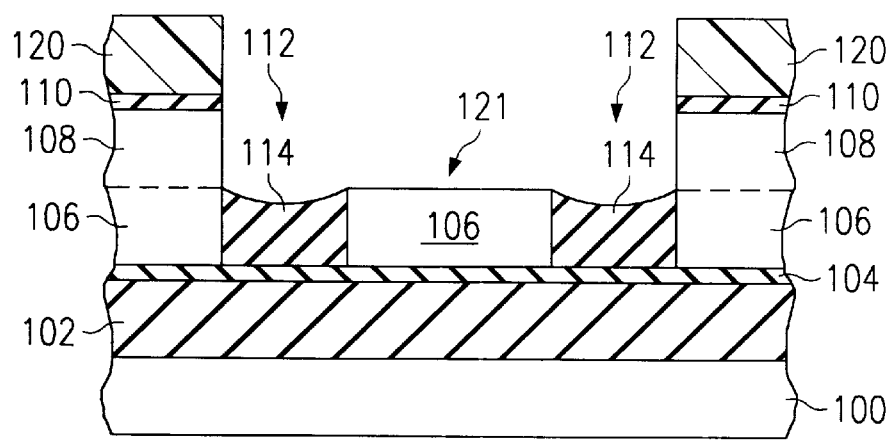

Next, the trench 121 etch is performed to etch IMD 108 as shown in FIG. 2C. In the preferred embodiment, a timed etch is used. If, however, an additional trench etch-stop layer is formed, between ILD 106 and IMD 108, an endpoint etch could be used. It should be noted however, that the incorporation of a silicon-nitride etch-stop layer increases the parasitic capacitance between metal interconnect layers.

The trench etch comprises an etch chemistry of a less-polymerizing fluorocarbon with a more-polymerizing fluorocarbon, nitrogen and argon. A low $N_2/Ar$ ratio (<1:3) is used. A less-polymerizing fluorocarbon refers to a C:F ratio of less than 1:3. Examples of less-polymerizing fluorocarbons include $CF_4$, $NF_3$, $C_2F_6$, and $C_XF_{3X+y}$ (Y>=0). Examples of more-polymerizing fluorocarbons include $C_4F_8$, $C_5F_8$, $C_4F_6$, $C_XH_YF_{2X+Z}$ (Z>=0, Y>=0).

Figure 3:
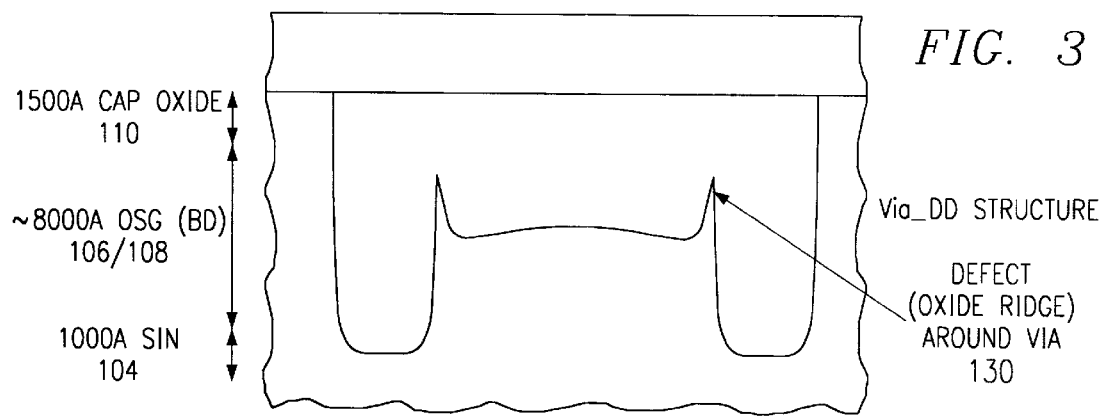
FIG. 3 is a cross-sectional drawing of a trench/via with oxide ridges.

The etch chemistry for the trench etch is critical. One proposed etch for etching OSG is $C_4F_8/N_2/Ar$. $C_4F_8$ is a higher-polymerizing fluorocarbon. A high $N_2/Ar$ ratio results in high etch rate. However, when a high $N_2/Ar$ ratio is used, oxide ridges 130 form around the vias, as shown in FIG. 3. 10 sccm of $C_4F_8$ and a $N_2/Ar$ ratio of 300:100 results in an etch rate of approximately 4600 Å/min. Oxide ridges 130 remain even after clean-up and significantly impact reliability. When the subsequently deposited metal barriers are formed, it is difficult to ensure that oxide ridges 130 are completely covered. In addition, oxide ridges may fall into the vias during subsequent processes (e.g., pre-sputter etch), resulting in poor metal barrier coverage.

Figure 4:
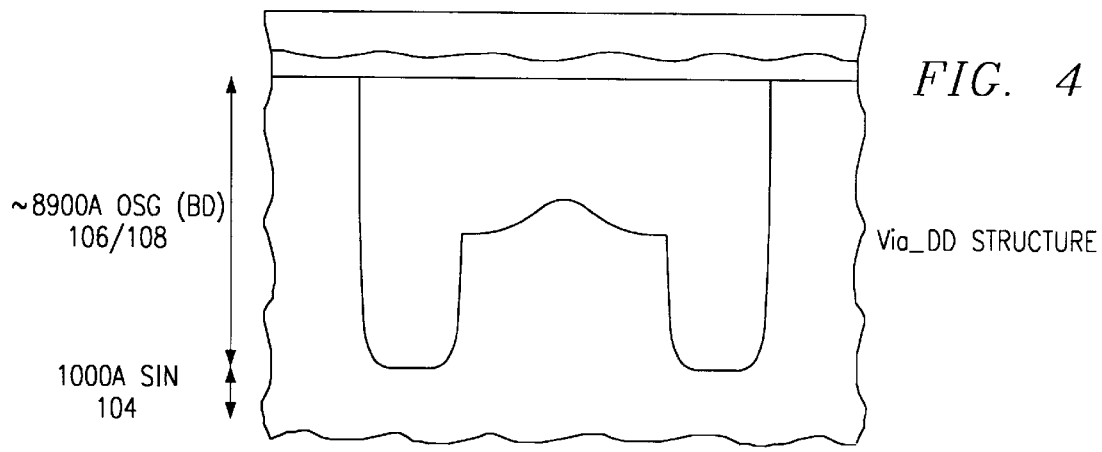
FIG. 4 is a cross-section drawing of a trench/via without oxide ridges but with a low etch rate chemistry.

A low $N_2/Ar$ ratio eliminates the oxide ridges as shown in FIG. 4. Unfortunately, the etch rate also reduces significantly. When 10 sccm of $C_4F_8$ is used with a $N_2/Ar$ ratio of 50:450, the etch rate reduces to approximately 1350 Å/min. The low etch rate reduces throughput.

Figure 5:
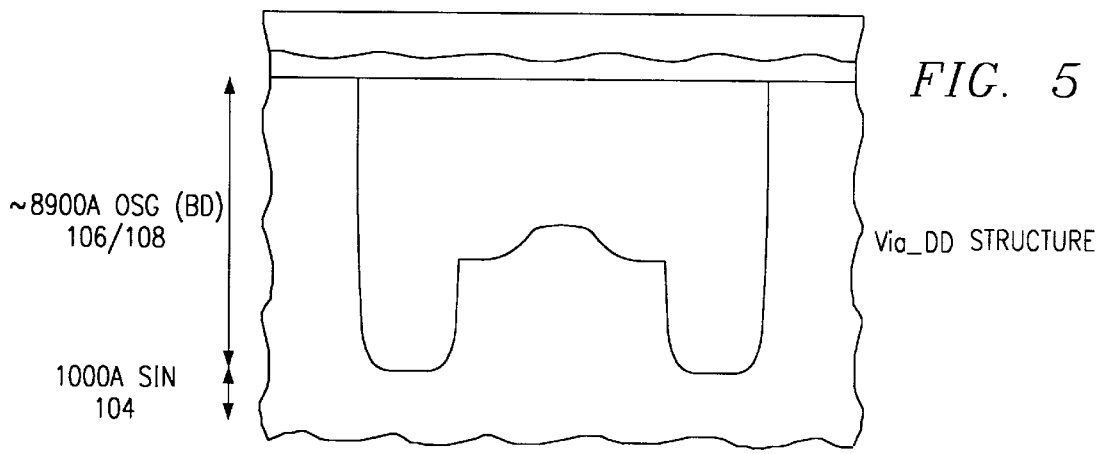
FIG. 5 is a cross-sectional diagram of a trench/via etched according to the invention with no oxide ridges and high etch rate when a less-polymerizing fluorocarbon was added to the trench etch chemistry.

The etch chemistry according to the invention, combines a less-polymerizing fluorocarbon, such as $CF_4$ with a higher-polymerizing fluorocarbon, such as $C_4F_8$, and low $N_2/Ar$ ratio. The low $N_2/Ar$ ratio eliminates the oxide ridges, as shown in FIG. 5. The combined fluorocarbons improve etch rate without increasing oxide ridges or increasing CD bias. A 10 sccm $C_4F_8$, $N_2$:Ar=100:400 and 30 sccm $CF_4$ etch chemistry results in no oxide ridges, an etch rate of approximately 3480 Å/min and a CD bias of approximately 0.003 $\mu$m.

Because $CF_4$ is a less-polymerizing fluorocarbon, adding it to the etch chemistry increases the etch rate significantly. However, it does not increase the CD bias or cause the formation of ridges. Thus, the etch rate and ridge formation can be controlled independently. Furthermore, by adjusting the flow rates of the two fluorocarbons, various C:F ratios can be achieved. This is not possible with a single fluorocarbon.

Figure 2D:
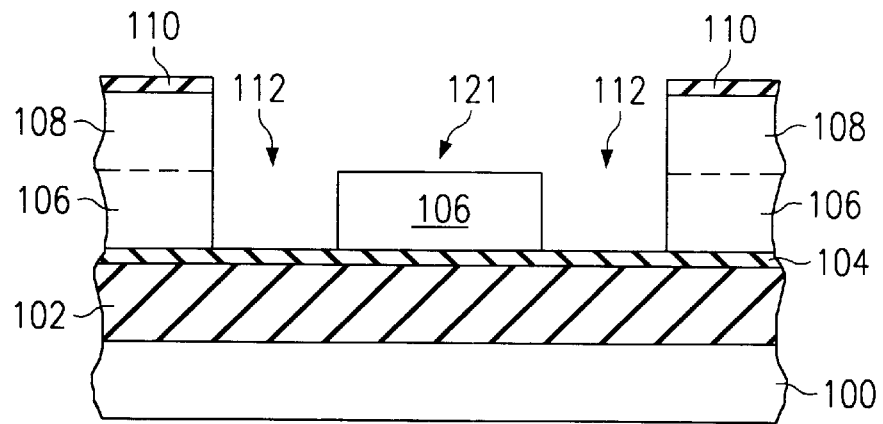

Referring to FIG. 2D, the resist and barc from trench pattern 120 is removed, for example, by ashing. (If the capping layer is thin (e.g., <500 Å), it can be removed during etch-stop layer etch. However, if the capping layer is >500 Å, it is removed during metal CMP.)

Figure 2E:
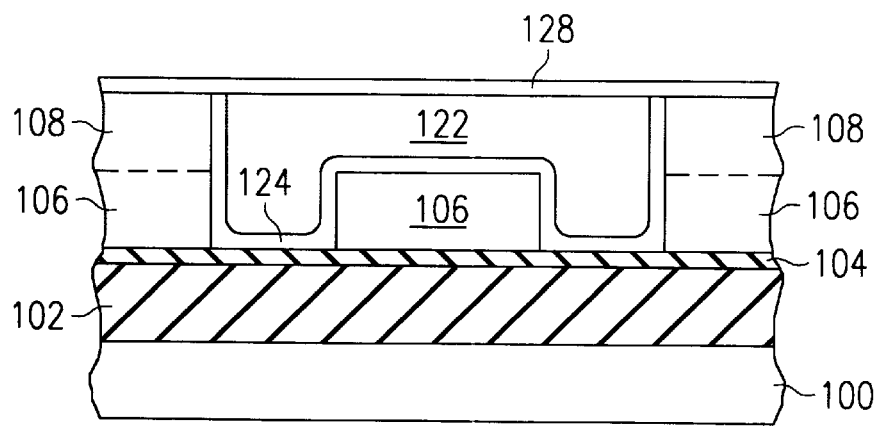

Processing then continues with the formation of the second metal interconnect layer 122, as shown in FIG. 2E. (Although referred to as the second metal interconnect layer, layer 122 can be any metal interconnect layer other than the lowest interconnect layer.) Typically, a barrier layer 124, such as tantalum-nitride (TaN) is deposited first. Due to the fact that no oxide pillars are formed, it is fairly easy to form a continuous barrier layer 124 in the trench/via. This advantage also increases the process margin. A purpose of the barrier layer is to prevent diffusion of the subsequently formed metal into the IMD/ILD. Breaks in the barrier layer allow metal diffusion and thus reduce yield and reliability. The invention thus improves both the yield and reliability by preventing the formation of oxide ridges and reducing defects in the via. It also improves trench etch throughput.

After the barrier layer 124, a copper seed layer is typically formed. This is followed by the formation of the copper interconnect 126 and a top nitride ($Si_3N_4$) capping layer 128. The above process can then be repeated to form subsequent metal interconnect layers.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

In the claims:

1. A method of forming an integrated circuit, comprising the steps of:
    forming a dielectric layer having a dielectric constant less than 3.5 over a semiconductor body;
    forming a via in said dielectric layer;
    forming a trench pattern over said dielectric layer;
    etching a trench through a portion of said dielectric layer using an etch chemistry comprising a less-polymerizing fluorocarbon, a higher-polymerizing fluorocarbon, nitrogen and argon with a low nitrogen:argon ratio; and
    forming a metal layer in said via and said trench.

2. The method of claim 1, wherein said etch chemistry comprises $CF_4$ as the less-polymerizing fluorocarbon, $C_4F_8$, $N_2$ and Ar.

3. The method of claim 1, wherein the nitrogen: argon ratio is less than 1:3.

4. The method of claim 1, wherein the nitrogen:argon ratio is approximately 100:400.

5. The method of claim 1, wherein the step of forming a dielectric layer comprises the steps of:

forming a first etch-stop layer over said semiconductor body;

forming an interlevel dielectric layer (ILD) over said first etch-stop; and forming an intermetal dielectric layer (IMD) over said interlevel dielectric, wherein said via extends through said ILD and said trench extends through said IMD.

6. The method of claim 5, further comprising the step of forming a second etch-stop layer between said ILD and said IMD.

7. The method of claim 1, further comprising the step of forming a capping layer over said dielectric prior to forming said via.

8. The method of claim 7, wherein said capping layer comprises an oxide.

9. The method of claim 7, wherein said capping layer comprises an oxide deposited by plasma enhanced tetraethyoxysilane.

10. The method of claim 1, wherein said dielectric layer comprises organo-silicate glass.

11. The method of claim 1 wherein said dielectric layer comprises an ultra-low-k dielectric having a dielectric constant less than 2.7.

12. A method of forming an integrated circuit, comprising the steps of:

forming a first metal interconnect layer over a semiconductor body;

forming an etch-stop layer over said first metal interconnect layer;

forming a dielectric layer comprising organo-silicate glass over said etch-stop layer;

forming a via through said dielectric layer to said etch-stop layer;

forming a trench pattern over said dielectric layer;

dry etching a trench in said dielectric layer, said dry etching a trench step using an etch chemistry comprising a less-polymerizing fluorocarbon, a more-polymerizing fluorocarbon, nitrogen and argon; and forming a metal layer in said via and said trench.

13. The method of claim 12, wherein said less-polymerizing fluorocarbon comprises $CF_4$.

14. The method of claim 12, wherein said more-polymerizing fluorocarbon comprises $C_4F_8$.

15. The method of claim 12, wherein said etch chemistry comprises a nitrogen: argon ratio of less than 1:3.

16. The method of claim 12, wherein said etch chemistry comprises a nitrogen: argon ratio of approximately 100:400.

17. The method of claim 12, wherein the step of forming a dielectric layer comprises the steps of:

forming an interlevel dielectric layer (ILD) over said first etch-stop; and forming an intermetal dielectric layer (IMD) over said interlevel dielectric.

18. The method of claim 17, further comprising the step of forming a second etch-stop layer between said ILD and said IMD.

* * * * *